(12) United States Patent
Ogawa et al.

(10) Patent No.: US 8,217,817 B2
(45) Date of Patent: *Jul. 10, 2012

(54) CURRENT SWITCH CIRCUIT AND D/A CONVERTER, SEMICONDUCTOR INTEGRATED CIRCUIT, AND COMMUNICATION DEVICE USING THE SAME

(75) Inventors: Tomohiro Ogawa, Osaka (JP); Heiji Ikoma, Nara (JP)

(73) Assignee: Panasonic Corporation, Osaka (JP)

( * ) Notice: Subject to any disclaimer, the term of this patent is extended or adjusted under 35 U.S.C. 154(b) by 65 days.

This patent is subject to a terminal disclaimer.

(21) Appl. No.: 12/850,313

(22) Filed: Aug. 4, 2010

(65) Prior Publication Data

US 2010/0315276 A1    Dec. 16, 2010

Related U.S. Application Data

(62) Division of application No. 12/278,367, filed as application No. PCT/JP2007/070649 on Oct. 23, 2007, now Pat. No. 7,796,073.

(30) Foreign Application Priority Data

Jan. 10, 2007    (JP) .................................. 2007-002608

(51) Int. Cl.
H03M 9/00    (2006.01)

(52) U.S. Cl. ........................ 341/144; 341/136; 341/153
(58) Field of Classification Search .................. 341/118, 341/120, 136, 144, 153
See application file for complete search history.

(56) References Cited

U.S. PATENT DOCUMENTS

| | | | | |
|---|---|---|---|---|
| 5,825,317 A | * | 10/1998 | Anderson et al. | 341/120 |
| 5,854,569 A | | 12/1998 | Kohno et al. | |
| 6,353,402 B1 | * | 3/2002 | Kanamori | 341/118 |
| 6,518,906 B2 | | 2/2003 | Abel et al. | |
| 6,842,132 B2 | * | 1/2005 | Schafferer | 341/144 |
| 6,927,714 B1 | * | 8/2005 | Teterwak | 341/136 |
| 6,967,609 B1 | * | 11/2005 | Bicakci et al. | 341/144 |

(Continued)

FOREIGN PATENT DOCUMENTS

JP    2005-72794    3/2005

OTHER PUBLICATIONS

Japanese Notice of Reasons for Rejection issued in Japanese Patent Application No. JP 2010-177542 dated May 22, 2012.

Primary Examiner — Linh Nguyen
(74) Attorney, Agent, or Firm — McDermott Will & Emery LLP

(57) ABSTRACT

[Means for Solving the Problem] In a current switch circuit A used for a current steering D/A converter, a current switch basic circuit 1 includes first and second transistors Tr121 and Tr122 included in a differential switch 12. A threshold voltage control circuit 5 has an output terminal Vbout controlling the substrate voltage to be outputted to the substrate terminal of each of the two transistors Tr121 and Tr122 included in the differential switch 12 for controlling the threshold voltage of the two transistors of the differential switch. Accordingly, the present invention improves the decrease in the dynamic range of the current switch basic circuit 1 dependent on the threshold of each of the two transistors in the differential switch 12 and realizes a wider output voltage range without causing deterioration in properties even in a case that the power voltage is reduced in the current switch basic circuit 1.

12 Claims, 6 Drawing Sheets

U.S. PATENT DOCUMENTS

| | | |
|---|---|---|
| 7,019,676 B2 * | 3/2006 | Ikoma et al. .................. 341/144 |
| 7,023,367 B1 * | 4/2006 | Manganaro .................. 341/136 |
| 7,129,871 B1 * | 10/2006 | Venes et al. .................. 341/136 |
| 7,292,172 B2 * | 11/2007 | Matsumoto et al. .......... 341/144 |
| 7,321,326 B2 | 1/2008 | Imai |
| 7,388,531 B1 | 6/2008 | Cyrusian |
| 7,796,073 B2 * | 9/2010 | Ogawa et al. ................. 341/144 |
| 2002/0044076 A1 | 4/2002 | Yao et al. |
| 2005/0218935 A1 | 10/2005 | Watarai |
| 2006/0044169 A1 | 3/2006 | Matsumoto et al. |

* cited by examiner

CURRENT SWITCH CIRCUIT AND D/A CONVERTER, SEMICONDUCTOR INTEGRATED CIRCUIT, AND COMMUNICATION DEVICE USING THE SAME

This application is a Divisional of U.S. patent application Ser. No. 12/278,367, filed on Aug. 5, 2008, now U.S. Pat. No. 7,796,073, which is a U.S. National Phase under 35 U.S.C. §371 of International Application No. PCT/JP2007/070649, filed on Oct. 23, 2007, which in turn claims the benefit of Japanese Application No. 2007-002608, filed on Jan. 10, 2007, the disclosures of which Applications are incorporated by reference herein.

TECHNICAL FIELD

The present invention relates to a current switch circuit, and particularly relates to a technique for a D/A converter (DAC) for communication that ameliorates the problem of a decrease in the dynamic range under low power voltage to realize a wider output voltage range.

BACKGROUND ART

In recent years, to take advantage of low costs of CMOS, SOCs (System On Chip) were increasingly produced which mixed digital and analog circuits on one chip. In contrast, various information appliances were introduced to the market in recent years, and semiconductor integrated circuit devices, particularly LSIs, used for such appliances are developed. Since such SOCs became significantly large-scaled, there are strong demands on them for higher performance, more multifunctionality, miniaturization, and lower power consumption. The production processes are thus on a steady path of microfabrication.

In such a trend, D/A converters are used in various electronic devices for the purposes including control systems, display systems, video systems, audio systems, and communication systems. Although current steering D/A converters are essential which enable a high speed operation in LSIs for video and communication, the power voltage is low due to power reduction. Even in such a case however, there is a strong demand for securing a wide output voltage range because of the system demands and consideration for noise immunity.

Conventional techniques in the fields include the following, for example. FIGS. 5 and 6 are block diagrams of conventional current switch circuits. FIG. 5 of a prior art shows a circuit structure of a known current switch circuit. FIG. 6 shows a circuit structure of a conventional current switch circuit described in Patent Document 1 to solve the problem of FIG. 5.

A current switch circuit 2 shown in FIG. 5 includes a current source 21 and a differential switch 22. The current source 21 includes low voltage withstanding P channel type MOS transistors Tr211 and Tr212 each having a thin gate insulating film for operation at a low power voltage. The source terminal of the transistor 211 is connected to a first power potential VDD (in this section, VDD=1.8 V), and the drain terminal is connected to the source terminal of the transistor Tr212, and stabilized bias voltage Vbias1 is applied to the gate terminal. The drain terminal of the transistor Tr212 is connected to a node N10, and stabilized bias voltage Vbias2 is applied to the gate terminal. The substrate terminals of the two transistors Tr211 and Tr212 are connected to the first power potential VDD. Threshold voltage Vth of the low voltage withstanding transistor is set at approximately 0.3 V.

The differential switch 22 includes P channel type MOS transistors Tr221 and Tr222 each having the same low gate-withstanding voltage as that of the transistors of the current source 21. The source terminal of the transistor Tr221 is connected to the node N10, the drain terminal is connected to a non-inverting output terminal DAOUT10, and a positive phase digital signal outputted from a driving unit 20 is applied to the gate terminal of Tr221. In contrast, the source terminal of the transistor Tr222 is connected to the node N10, the drain terminal is connected to an inverting output terminal NDAOUT10, and a negative phase digital signal outputted from the driving unit 20 is applied to the gate terminal. The substrate terminals of the two transistors Tr221 and Tr222 are connected to the first power potential VDD.

Output load resistors R10 and R11 generate, as output current Iout of the current source 21 comes in, a positive phase output voltage at the non-inverting output terminal DAOUT10 and a negative phase output voltage at the inverting output terminal NDAOUT10 respectively, in which these output voltages are obtained from the current value of output current Iout and the resistance values of the output load resistors R10 and R11.

In a case that the D/A converter includes a plurality of current switch circuits 2, to maintain the linearity of the output signal of the D/A converter, i.e. not to deteriorate the SFDR (Spurious Free Dynamic Range), it is necessary to maintain the linearity of the output signals of the differential switches 22. In order to maintain the linearity of the output signals of the differential switches 22, it is necessary that the transistors Tr221 and Tr222 included in each differential switch 22 are operated in the saturation regions.

In the saturation regions of the transistors Tr221 and Tr222 shown in FIG. 5, gate-source voltage Vgs for each transistor is expressed as the following formula:

$$|Vgs| = |Vth| + \sqrt{|Id|/(\mu Cox/2 \cdot W/L)} \quad (1),$$

wherein Id denotes the drain current, μ denotes the hole mobility, Cox denotes the gate capacitance per unit area, W denotes the gate width, and L denotes the gate length.

The condition for operating the transistors in the saturation regions is expressed as the following formula, by denoting the drain-source voltage as Vds:

$$|Vds| \geq |Vgs - Vth| \quad (2).$$

The transistors Tr221 and Tr222 included in each differential switch 22 are turned on when the output signal from the driving unit is L (=VSS), and according to the formula (2) it is understood that the output voltage range of the D/A converter is from 0 to Vth.

As described above, in a case that a low voltage withstanding transistor is used to reduce the power voltage, the threshold voltage is approximately 0.3 V, and thus the output voltage range is limited to from 0 V to 0.3 V.

Maximum output amplitude Vomax of the D/A converter is determined according to the system demands, and a value of not less than 0.5V is often demanded.

FIG. 6 is a drawing that shows the technique of Patent Document 1. This is different from FIG. 5 in the point that the driving unit 20 includes an offset circuit 301 inside.

The current switch circuit 2 showed in FIG. 6 includes the current source 21 and the differential switch 22. The current source 21 includes the low voltage withstanding P type MOS transistors Tr211 and Tr212 for operation at a low power voltage. The source terminal of the transistor 211 is connected to the first power potential VDD, and the drain terminal is connected to the source terminal of the transistor Tr212, and stabilized voltage Vbias1 is applied to the gate terminal. The drain terminal of the other transistor Tr212 is connected to the node N10, and stabilized voltage Vbias2 is applied to the gate terminal. The substrate terminals of the two transistors Tr211 and Tr212 are connected to the first power potential VDD.

In FIG. 6, the differential switch 22 includes low voltage withstanding P channel type MOS transistors Tr221 and Tr222. The source terminal of the transistor Tr221 is connected to the node N10, the drain terminal is connected to a non-inverting output terminal DAOUT10, and a positive phase digital signal outputted from a driving unit 30 is applied to the gate terminal of Tr221. The source terminal of the other transistor Tr222 is connected to the node N10, the drain terminal is connected to the inverting output terminal NDAOUT10, and a negative phase digital signal outputted from the driving unit 30 is applied to the gate terminal. The substrate terminals of the two transistors Tr221 and Tr222 are connected to the first power potential VDD.

The output load resistors R10 and R11 generate, as output current Iout of the current source circuit 21 comes in, a positive phase output voltage at the non-inverting output terminal DAOUT10 and a negative phase output voltage at the inverting output terminal NDAOUT10 respectively, in which these output voltages are obtained from the current value of output current Iout and the resistance values of the output load resistors R10 and R11.

According to digital signal Din inputted at a first stage of the driving unit 30, a differential signal of L (=VSS) or H (=VDD) is generated. The offset circuit 301 included inside the driving unit 30 outputs differential signals DATA and NDATA with given offset voltages V1 and V2 (L=VSS+V1, H=VDD−V2) to the gate terminals of the transistors Tr221 and Tr222 included in the differential switch 22.

As described above, to maintain the linearity of the output signal of the D/A converter including the current switch circuit 2, it is necessary that the transistors Tr221 and Tr222 included in the differential switch 22 of the current switch circuit 2 are operated in the saturation regions and to fulfil Formula (2) above:

$$|Vds| \geq |Vgs - Vth| \quad (2).$$

The offset circuit 301 in the driving unit 30 determines the voltage, as VSS+V1, to be applied to the gate terminals during operation of the transistors Tr221 and Tr222 included in the differential switch circuit 22, and as a result, the output voltage range according to Formula (2) above is from 0 to Vth+V1.

Consequently, this output voltage range is from 0 to V/+Vth, and thus it is larger than the output voltage range of from 0 to Vth for the case of FIG. 5 by the amount of offset voltage V1. The technique of Patent Document 1 provided with the offset circuit 301 shown in FIG. 6 achieves a wider output voltage range by controlling gate-source voltage Vgs at a small value in Formula (2) above.

Patent Document 1: JP 2005-72794 A

DISCLOSURE OF INVENTION

Problems to be Solved by the Invention

A conventional current switch circuit 2 using the driving unit 30 which includes the offset circuit 301 in FIG. 6 is provided with an additional circuit, which is the offset circuit 301 inside the driving unit 30, as means for varying the voltage to be applied to the gate terminals of the transistors Tr221 and Tr222 included in the differential switch 22. Since the additional circuit is necessary for each of the plurality of current switch circuit 2, the number of gates in the D/A converter circuit increases, causing the problems of an increase of the chip area in a semiconductor integrated circuit and an increase in power consumption.

An object of the present invention is to provide a current switch circuit and a D/A converter and the like using the same, the current switch circuit realizing a wider output voltage range of, for example, a D/A converter for communication and reducing an increase in the area and power consumption, and to provide a current switch circuit and a D/A converter and the like using the same, the current switch circuit being capable of maintaining a constant output voltage range regardless of threshold voltage variations due to process variations and the like.

Means for Solving the Problems

The present invention achieves the object, as understood from Formula (2) above, by controlling the threshold voltage of a transistor at a high value, the transistor being included in a differential switch further included in a current switch circuit, and thus securing a wide output voltage range without causing deterioration in properties even in a case of the reduced power voltage of the current switch circuit.

Specifically, a current switch circuit of the present invention includes a current source and a differential switch connected to an output terminal of the current source. The current source includes at least one transistor having a gate terminal to which a bias voltage is applied that determines a value of a current to conduct. The differential switch includes first and second transistors, the transistors having source terminals connected to the output terminal of the current source in parallel, drain terminals as first and second output terminals respectively, and gate terminals to which complementary signals are inputted. The current switch circuit further includes a threshold voltage control circuit for outputting a substrate voltage to a substrate terminal of each of the first and second transistors to adjust a threshold voltage of the first and second transistors.

In the current switch circuit according to the present invention, the threshold voltage control circuit includes: a reference voltage generating circuit for generating a reference voltage to determine the threshold voltage; and a substrate voltage control circuit for controlling a substrate voltage of a threshold voltage monitoring transistor in such a way that a voltage difference between the reference voltage generated in the reference voltage generating circuit and the bias voltage becomes the threshold voltage of the first and second transistors of the differential switch.

In the current switch circuit according to the present invention, the substrate voltage control circuit of the threshold voltage control circuit includes a threshold voltage monitoring circuit for monitoring that the threshold voltage of the monitoring transistor becomes the threshold voltage of the first and second transistors of the differential switch.

In the current switch circuit according to the present invention, the threshold voltage monitoring circuit includes the threshold voltage monitoring transistor.

In the current switch circuit according to the present invention, a gate length of the threshold voltage monitoring transistor included in the threshold voltage monitoring circuit is determined as equal to a gate length of the first and second transistors included in the differential switch.

A current switch circuit of the present invention includes a current source and a differential switch connected to an output terminal of the current source. The current source includes at least one transistor having a gate terminal to which a bias voltage is applied that determines a value of a current to conduct. The differential switch includes first and second transistors, the transistors having source terminals connected to an output terminal of the current source in parallel, drain terminals as first and second output terminals respectively, and gate terminals to which complementary signals are inputted. The first and second transistors of the differential switch has the threshold voltage determined to have an absolute value greater than an absolute value of a threshold voltage of the transistor included in the current source.

In the current switch circuit according to the present invention, each of the first and second transistors is formed of a field effect transistor.

In the current switch circuit according to the present invention, the field effect transistor is a P channel type transistor.

In the current switch circuit according to the present invention, the field effect transistor is an N channel type transistor.

In the current switch circuit according to the present invention, the transistor included in the current source is formed of a low voltage withstanding transistor having a gate insulating film with a predetermined thickness, each of the first and second transistors included in the differential switch is formed of a high voltage withstanding transistors having a gate insulating film with a thickness thicker than the predetermined thickness of the gate insulating film of the low voltage withstanding transistor, and the threshold voltage of the first and second transistors included in the differential switch is determined higher than a threshold voltage of the transistor included in the current source.

In the current switch circuit according to the present invention, each of the first and second transistors included in the differential switch has an implantation concentration of impurities which is determined to be different from an implantation concentration of impurities to the transistor included in the current source, and the threshold voltage of the first and second transistors included in the differential switch is determined higher than a threshold voltage of the transistor included in the current source.

In the current switch circuit according to the present invention, the transistor included in the current source has a substrate terminal to which a predetermined voltage is applied, a voltage higher than the predetermined voltage is applied to the substrate terminal of each of the first and second transistors included in the differential switch, and the threshold voltage of the first and second transistors included in the differential switch is determined to be higher than a threshold voltage of the transistor included in the current source.

A D/A converter of the present invention includes the current switch circuit.

A D/A converter of the present invention includes a plurality of current switch circuits, each current switch circuit set forth as above. The threshold voltage monitoring transistor has a gate width determined to be equal to or more than a gate width of the transistor included in the differential switch circuit in a current switch circuit for LSB among the plurality of current switch circuits.

A semiconductor integrated circuit of the present invention includes the D/A converter.

A communication device of the present invention includes the semiconductor integrated circuit.

A threshold voltage control circuit of the present invention includes: a reference voltage generating circuit; a substrate voltage control circuit for controlling a substrate voltage of a first transistor in such a way that a voltage difference between a reference voltage generated in the reference voltage generating circuit and a bias voltage becomes a threshold voltage of the first transistor; and a second transistor having threshold properties same as those of the first transistor and having a substrate terminal to which an output voltage of the substrate voltage control circuit is inputted.

As described above, the present invention enables the first and second transistors included in a differential switch to realize the high threshold voltage, and thus realizes a wide output voltage range without causing deterioration in properties of the current switch circuit and maintains the output voltage range at a constant level regardless of the threshold voltage variations due to, for example, production process variations to remain stable against the production variations.

Particularly, in a case that a D/A converter includes a plurality of current switch circuits, the present invention allows the plurality of current switch circuits to use one identical threshold voltage control circuit, and thus effectively reduces an increase in the area of a semiconductor chip including the D/A converter and also reduces power consumption.

Since the present invention realizes the high threshold voltage of the first and second transistors included in the differential switch according to the production method, it also realizes a wide output voltage range without increasing the circuit scale and without causing deterioration in properties of the current switch circuit.

Effects of the Invention

As described above, according to the present invention, a wide output voltage range was realized without causing deterioration in properties of the current switch circuit by determining the threshold voltage of the first and second transistors included in the differential switch at a high level, it is possible to reduce an increase in the area of a semiconductor chip and an increase in power consumption and to maintain the output voltage range within a constant predetermined range regardless of the production process variations.

DESCRIPTION OF REFERENCE NUMERALS

Figure 1:
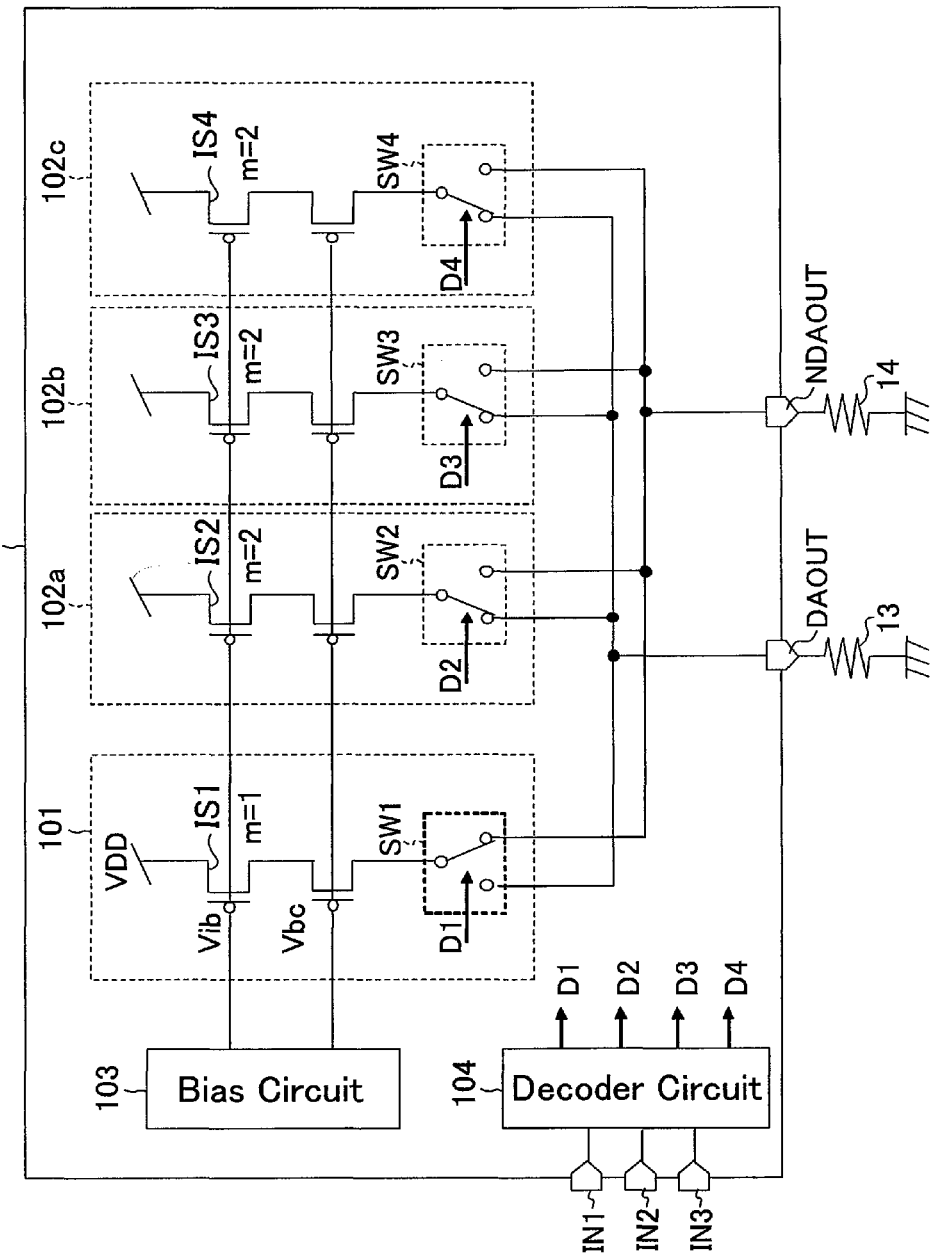
FIG. 1 is a diagram showing an overall schematic structure of a D/A converter including a current switch circuit according to the first embodiment of the present invention.

A Current Switch Circuit
1 Current Switch Basic Circuit
2 Driving Unit
5 Threshold Voltage Control Circuit
10 D/A Converter
11, 21 Current Source 12, 22 Differential Switch
13, 14 Resistor Element
51 Reference Voltage Generating Circuit
52 Substrate Voltage Control Circuit
521 Threshold Voltage Monitoring Circuit
Vbias1 Application Terminal of Bias Voltage 1
Vbias2 Application Terminal of Bias Voltage 2
VB Bias Voltage 3
DAOUT1, DAOUT10 Non-inverting Output Terminal (First Output Terminal)
NDAOUT1, NDAOUT10 Inverting Output Terminal (Second Output Terminal)
Tr111 Transistor included in Current Source
Tr521 Threshold Voltage Monitoring Transistor
101, 102a to 102c Current Switch Basic Circuit
103 Bias Circuit
104 Decoder Circuit Best Mode for Carrying out the Invention Embodiments of the present invention are described referring to the drawings. The components identical to those in the prior art are illustrated with the identical reference numerals.

First Embodiment

FIG. 1 shows the overall schematic structure of a D/A converter including a current switch circuit of this embodiment.

FIG. 1 shows a current steering D/A converter 10 which converts a 3-bit digital signal to an analog signal. The D/A converter 10 includes four current sources IS1 to IS4 each consisting of transistors connected in cascode, and the current value of the current sources is determined by bias voltages Vib and Vbc applied from a bias circuit 103 to respective gate terminals.

Respective output terminals of the current sources IS1 to IS4 are connected to differential switches SW1 to SW4 to form a current switch basic circuit 101. The current switch basic circuit 101 is a current switch basic circuit (a lower current switch) for LSB which outputs an LSB current, and the current switch basic circuits 102a to 102c are three current switch basic circuits (upper current switches) for MSB which output MSB currents. The upper current switch basic circuits 102a to 102c are thermometer code current switches which output three currents of the same magnitude, and the lower current switch basic circuit 101 is a binary code current switch conducting a current having a current value weighted by ½ of that of a current conducted by the thermometer current source.

Each of the differential switches SW1 to SW4 has one output terminal connected with each other to form a non-inverting output terminal DAOUT and has the other output terminal connected with each other to form an inverting output terminal NDAOUT.

In contrast, digital input signals inputted from digital input terminals IN1 to IN3 are first decoded into digital signals D1 to D4 at a decoder circuit 104, and then the decoded signals control differential switches SW1 to SW4 to switch each output current of current sources IS1 to IS4 between the non-inverting output terminal DAOUT and the inverting output terminal NDAOUT.

In the way described above, currents from current sources IS1 to IS4 are summed up according to the digital input codes at the non-inverting output terminal DAOUT and the inverting output terminal NDAOUT, and analog output currents are obtained.

The non-inverting output terminal DAOUT and the inverting output terminal NDAOUT are connected to resistor elements 13 and 14, respectively, between a ground and the terminals, and the analog output currents are converted into voltages to obtain differential analog output voltages according to digital input codes.

Figure 2:
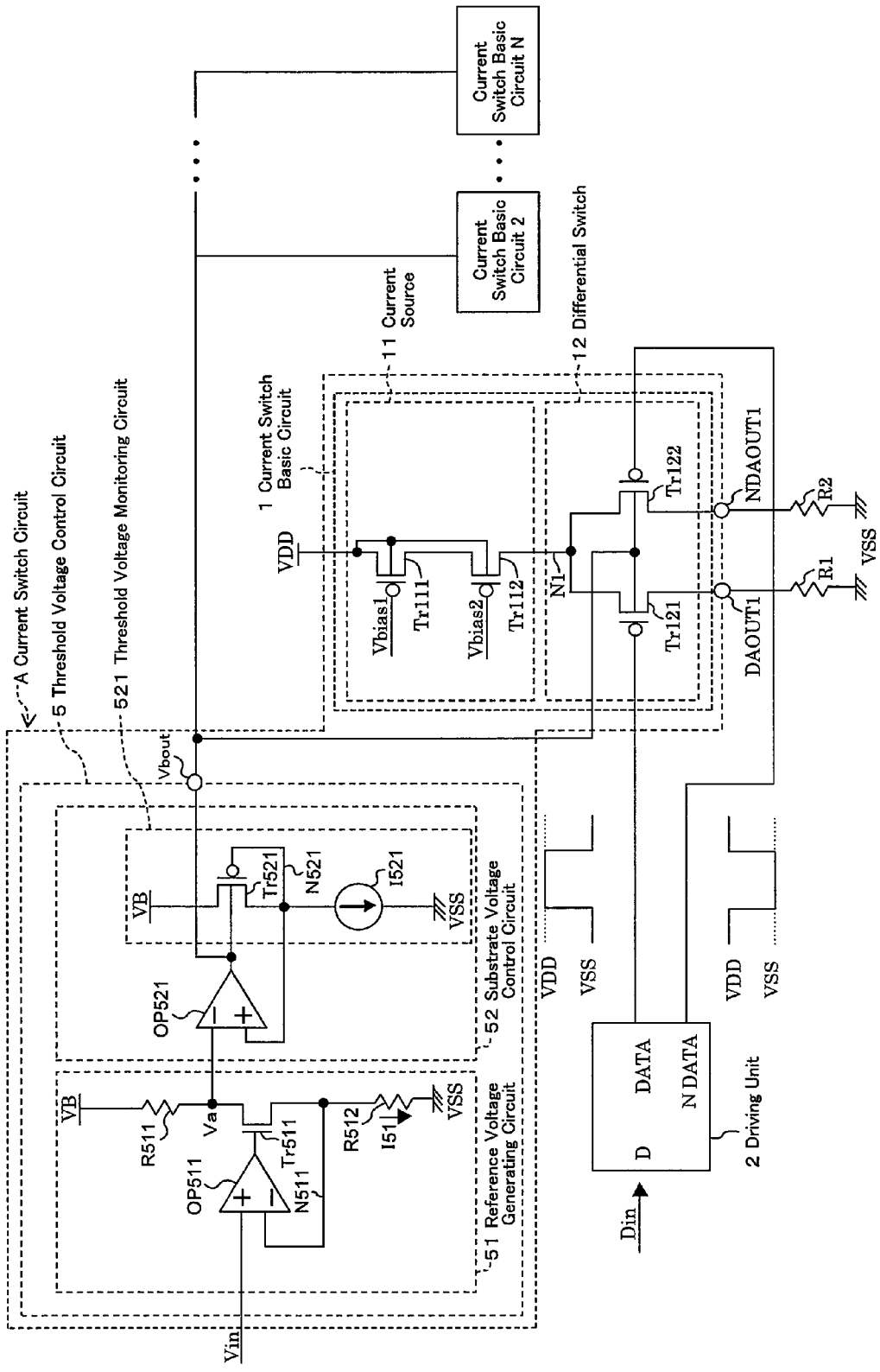
FIG. 2 is a circuit diagram showing an internal structure of the current switch circuit included in the D/A converter according to the first embodiment.

FIG. 2 shows internal structures of the current switch basic circuits 101 and 102a to 102c included in the D/A converter 10. In FIG. 2, these current switch basic circuits are referred to as current switch basic circuits 1 to N.

Since the current switch basic circuits 1 to N have an identical structure, FIG. 2 specifically shows the internal structure of the current switch basic circuit 1 only. The current switch basic circuit 1 includes a current source 11 and a differential switch 12. The element 5 denotes a threshold voltage control circuit, and the current switch basic circuit 1 and the threshold voltage control circuit 5 form a current switch circuit A of the present invention. Similarly, the threshold voltage control circuit 5 and each of the current switch basic circuits 2 to N form another current switch circuit A of the present invention. In FIG. 2, accordingly, the current switch basic circuits 1 to N share the threshold voltage control circuit 5 to form respective current switch circuits A.

In the current switch basic circuit 1, the current source 11 for an operation at a low power voltage includes low voltage withstanding P channel type MOS transistors Tr111 and Tr112 each having a thin gate insulating film. The transistor Tr111 has a source terminal connected to a first power potential VDD, a drain terminal connected to a source terminal of the transistor Tr112, and a gate terminal to which stabilized voltage Vbias1 is applied. The other transistor Tr112 has a drain terminal connected to a node N1 and a gate terminal to which stabilized voltage Vbias2 is applied. Each of the two transistors Tr111 and Tr112 has a substrate terminal connected to the first power potential VDD.

The differential switch 12 includes P channel type MOS transistors Tr121 and Tr122 each having the same low gate-withstanding voltage as that of the current source 11. The transistor Tr121 has a source terminal connected to the node N1, a drain terminal connected to a non-inverting output terminal (a first output terminal) DAOUT1, and a gate terminal to which a positive phase digital signal outputted from a driving unit 2 is applied. The other transistor Tr122 has a source terminal connected to the node N1, a drain terminal connected to an inverting output terminal (a second output terminal) NDAOUT1, and a gate terminal to which a negative phase digital signal outputted from the driving unit 2 is applied. Each of the two transistors Tr121 and Tr122 has a substrate terminal connected to an output terminal Vbout of the threshold voltage control circuit 5.

The driving unit 2 includes an input terminal D to input a digital signal and output terminals DATA and NDATA. The output terminal DATA is connected to the gate terminal of the transistor Tr121 included in the differential switch 12, and the other output terminal NDATA is connected to the gate terminal of the transistor Tr122.

An output load resistor R1 is connected between the non-inverting output terminal DAOUT1 and a second power potential VSS, and an output load resistor R2 is connected between the inverting output terminal NDAOUT1 and the second power potential VSS.

The threshold voltage control circuit 5 includes a substrate voltage control circuit 52 provided with a threshold voltage monitoring circuit 521 and a reference voltage generating circuit 51. The reference voltage generating circuit 51 includes resistors R511 and R512, an N channel type MOS transistor Tr511, and an operational amplifier OP511. The resistor R511 is connected between bias voltage VB and node Va. The transistor Tr511 has a drain terminal connected to node Va, a source terminal connected to node N511, and a gate terminal connected to an output terminal of the operational amplifier OP511. The operational amplifier OP511 has a non-inverting input terminal connected to an external terminal Vin and an inverting input terminal connected to node N511. The resistor R512 is connected between node N511 and a second power potential VSS.

The substrate voltage control circuit 52 includes an operational amplifier OP521 and the threshold voltage monitoring circuit 521. The threshold voltage monitoring circuit 521 includes a P channel type MOS transistor Tr521 for monitoring a threshold voltage and a current source 1521. The threshold voltage monitoring transistor Tr521 has a source terminal connected to bias voltage VB and a drain terminal and a gate terminal both connected to node N521. Node N521 is connected to a non-inverting input terminal of the operational amplifier OP521. The current source 1521 is connected between node N521 and a second power potential VSS and applies a micro current at approximately some μA. The operational amplifier OP521 has an inverting input terminal connected to node Va of the reference voltage generating circuit 51 and an output terminal connected to an output terminal Vbout and a substrate terminal of the threshold voltage monitoring transistor Tr521.

Bias voltage VB is defined as equal to the voltage of the source terminal of a transistor having the threshold voltage to be controlled (the node N1 in this embodiment).

The description below describes operations of the current switch circuit A, the driving unit 2 and the output load resistors R1 and R2 thus structured.

The transistor Tr111 in the current source 11 operates as a constant current source, and bias voltage Vbias1 is defined to satisfy a desired current value. The transistor Tr112 in the current source 11 is connected in cascode to the transistor Tr111 to increase the output resistance of the current source 11 and maintain the current at a constant level with respect to the variation in the voltage of node N1. The differential switch 12 switches the direction of constant current Iout, outputted from the current source 11, according to the complementary digital signals outputted from the driving unit 2 to conduct output current Iout to the non-inverting output terminal DAOUT1 or the inverting output terminal NDAOUT1.

The driving unit 2 generates the complementary digital signals to be outputted to the differential switch 12 according to inputted digital signal Din.

The output load resistors R1 and R2 generate, as output current Iout comes in, a positive phase output voltage to the non-inverting output terminal DAOUT1 and a negative phase output voltage to the inverting output terminal NDAOUT1 respectively, wherein the positive phase and negative phase output voltages are obtained from the current value of output current Iout and the resistance values of the resistors R1 and R2.

The reference voltage generating circuit 51 in the threshold voltage control circuit 5 is a negative feedback loop, and external input voltage Vin is inputted to the non-inverting input terminal of the operational amplifier OP511. (Input voltage Vin is desirably an output voltage of the band gap reference (BGR) independent of the power voltage and the temperature.) Since the voltage of node N511 is equal to input voltage Vin, a current determined by input voltage Vin and the resistance value of the resistor R512 passes through the resistors R511, Tr511, and R521, and the current value is obtained from Formula (3) below.

$$I51 = Vin/R512 \quad (3)$$

The potential of node Va is obtained by deducting the amount of the voltage drop of the resistor R511 from bias voltage VB, and is obtained from Formula (4) below.

$$Va = VB - I51 \cdot R511 \quad (4)$$

In the substrate voltage control circuit 52, the current passes through the threshold voltage monitoring transistor Tr521 included in the threshold voltage monitoring circuit 521 is determined by the current source 1521, and the current source 1521 is determined to conduct a little amount of a micro current only. In this case, according to Formula (5) below, gate-source voltage Vgs of the threshold voltage monitoring transistor Tr521 becomes a value approximately equivalent to threshold voltage Vth (near the boundary to turn on or off the threshold voltage monitoring transistor Tr521. Vgs Vth).

$$Id = \kappa(Vgs - Vth)^2 \quad (5)$$

In Formula (5), κ denotes a constant depending on the transistor size.

On the input of output voltage Va of the reference voltage generating circuit 51 to the inverting input terminal of the operational amplifier OP521, the threshold voltage of the threshold voltage monitoring transistor Tr521 is controlled according to Formula (6) to set the voltage of node N521 equal to Va, and the voltage applied to the gate terminal of the threshold voltage monitoring transistor Tr521 also becomes equal to the potential of node Va.

$$Vth = Vt0 + \gamma\left(\sqrt{(2\phi f + Vsb)} - \sqrt{(2\phi f)}\right) \quad (6)$$
$$= Vt0 + Vc$$

wherein, Vt0 denotes the threshold voltage for the case of Vsb=0V, Vc denotes the value obtained from $\gamma(\sqrt{(2\phi f+Vsb)}-\sqrt{(2\phi f)})$, ϕf denotes the Fermi level, γ denotes a parameter intrinsic to the transistor, and Vbs denotes the voltage between the substrate and the source.

That is, since voltage Va obtained from Formula (4) above is applied to the gate terminal of the threshold voltage monitoring transistor Tr521 and bias voltage VB is applied to the source terminal of the threshold voltage monitoring transistor Tr521, gate-source voltage Vgs applied to the threshold voltage monitoring transistor Tr521 becomes |Vgs|=|VB−Va|. Formula (7) below is derived from the relationship of |Vth|≈|Vgs|.

$$|Vth| \approx |Vgs| = |VB - Va| \quad (7)$$
$$= |VB - (VB - I51 \cdot R511)|$$
$$= |I51 \cdot R511|$$
$$= |(Vin/R512) \cdot R511|$$

According to Formula (7), it is thus found that external input voltage Vin and the internal resistors R511 and R512 control the threshold voltage of the threshold voltage monitoring transistor Tr521.

Since gate-source voltage Vgs of the threshold voltage monitoring transistor Tr521 is approximately equal to threshold voltage Vth as described above, the substrate voltage control circuit 52 outputs such a voltage that makes the threshold voltage of the threshold voltage monitoring transistor Tr521 equal to |VB−Va| to the output terminal Vbout.

Since voltage Vbout is similarly applied to the substrate terminals of the two transistors Tr121 and Tr122 included in the differential switch 12, it is found that the threshold voltage equivalent to that of the threshold voltage monitoring transistor Tr521 may be determined by using transistors with the properties equivalent to those of the threshold voltage monitoring transistor Tr521. In such a case, the gate length of the two transistors Tr121 and Tr122 included in the differential switch 12 is desirably same as the gate length L of the threshold voltage monitoring transistor Tr521. In a case of using transistors included in differential switches of a plurality of sizes in the D/A converter 10, the gate width W of the threshold voltage monitoring transistor Tr521 is desirably equal to or wider than the gate width W of the minimum sized transistor used as the differential switch of the current switch basic circuit 101 for LSB shown in FIG. 1.

Although this embodiment uses a low voltage withstanding transistors as the transistors Tr121 and Tr122 included in the differential switch 12, any structure may be employed that makes the threshold voltage of the P channel transistors Tr121 and Tr122 included in the differential switch 12 to be larger than the threshold voltage of the P channel transistor Tr111 included in the current source 11, for example, by using a high voltage withstanding transistor having a gate insulating film thicker than the predetermined thickness of the gate insulating film of the transistor Tr111 of the current source 11 or by using a thin gate insulating film while setting the impurity concentration lower during an impurity implantation step in production processes.

As described above, the current switch circuit A of the first embodiment is capable of controlling the threshold voltage of the transistors Tr121 and Tr122 included in the differential switch 12 at an approximately constant level by including the threshold voltage control circuit 5.

By connecting the substrate voltage control circuit 52, it has an advantage of increasing the output voltage range (the range for operation of the P channel type MOS transistors Tr121 and Tr122 included in the differential switch 12 in the saturation region) up to from 0 to (VDD−Va) V whereas conventional techniques limited the range approximately within from 0 to 0.3 V. At the same time, since the threshold voltage is controlled, the output voltage range is maintained at a constant level regardless of production process variations, particularly the threshold voltage variations and thus it also has an advantage of remaining stable against the production variations and the temperature changes.

Second Embodiment

Figure 3:
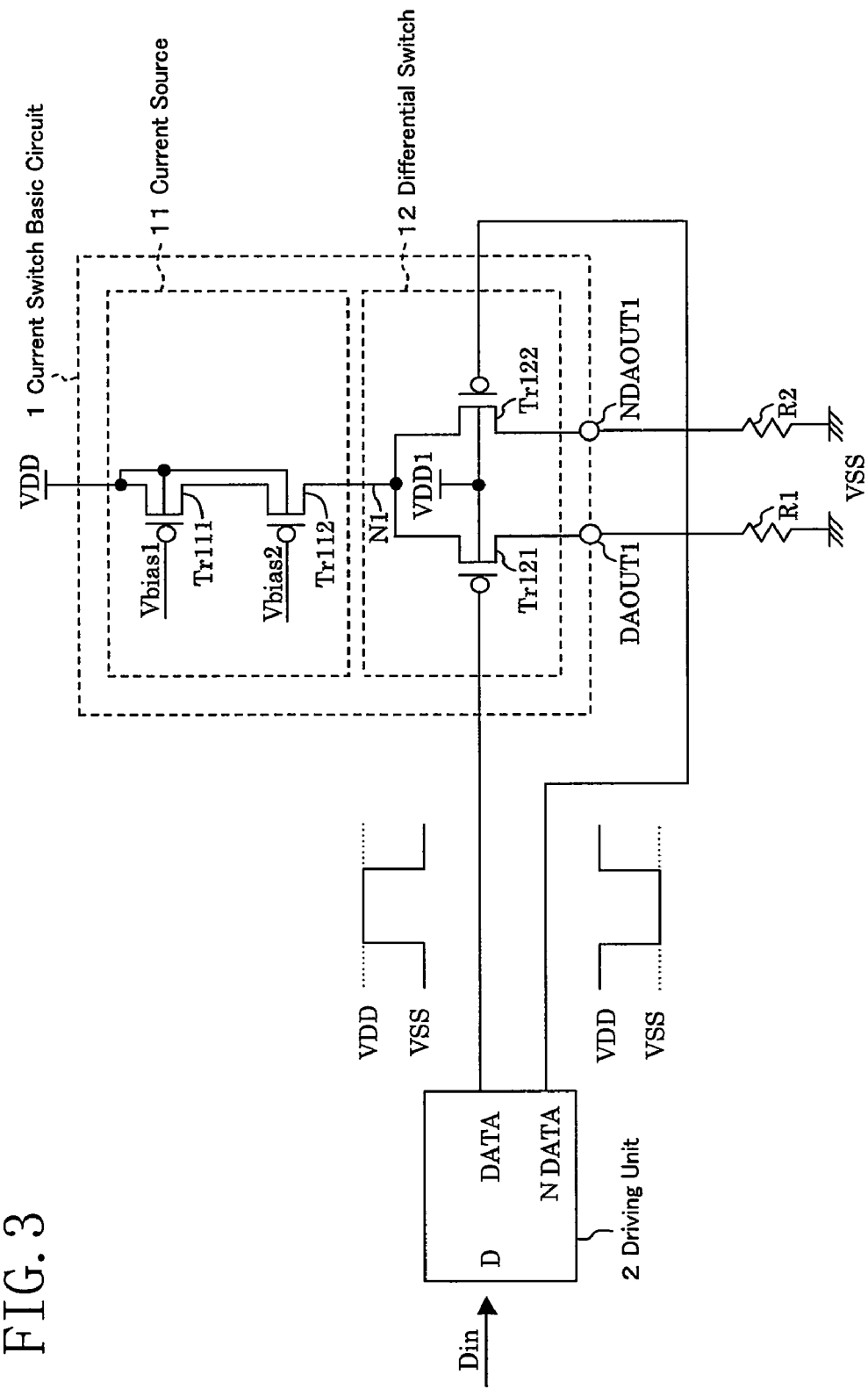
FIG. 3 is a circuit diagram showing a main structure inside of a current switch circuit according to the second embodiment of the present invention.

FIG. 3 is a block diagram of the current switch basic circuit 1, the driving unit 2, and the output load resistors R1 and R2 showing the second embodiment of the present invention. Different from the first embodiment, the current switch circuit A does not include a threshold voltage control circuit inside.

The current switch basic circuit 1 includes the current source 11 and the differential switch 12. The current source 11 for an operation at a low power voltage includes the low voltage withstanding P channel type MOS transistors Tr111 and Tr112 each having a thin gate insulating film. The transistor Tr111 has the source terminal connected to the first power potential VDD, the drain terminal connected to the source terminal of the transistor Tr112, and the gate terminal to which stabilized voltage Vbias1 is applied. The other transistor Tr112 has the drain terminal connected to the node N1 and the gate terminal to which stabilized voltage Vbias2 is applied. Each of the two transistors Tr111 and Tr112 has the substrate terminal connected to the first power potential VDD.

The differential switch 12 includes the P channel type MOS transistors Tr121 and Tr122 each having the same low gate-withstanding voltage as that of the current source 11. The transistor Tr121 has the source terminal connected to the node N1, the drain terminal connected to the non-inverting output terminal DAOUT1, and the gate terminal to which a positive phase digital signal outputted from the driving unit 2 is applied. The other transistor Tr122 has the source terminal connected to the node N1, the drain terminal connected to the inverting output terminal NDAOUT1, and the gate terminal to which a negative phase digital signal outputted from the driving unit 2 is applied. Each of these two transistors Tr121 and Tr122 has the substrate terminal applied a third power potential VDD1 which is higher than the first power potential VDD.

The driving unit 2 includes the input terminal D to input a digital signal and the complementary output terminals DATA and NDATA. The output terminal DATA is connected to the gate terminal of the transistor Tr121 included in the differential switch 12, and the other output terminal NDATA is connected to the gate terminal of the other transistor Tr122.

The output load resistor R1 is connected between the non-inverting output terminal DAOUT1 and the second power potential VSS, and the output load resistor R2 is connected between the inverting output terminal NDAOUT1 and the second power potential VSS.

The description below describes operations of the current switch basic circuit 1 in the current switch circuit A, the driving unit 2 and the output load resistors R1 and R2 thus structured.

The transistor Tr111 in the current source 11 operates as a constant current source, and bias voltage Vbias1 is defined to satisfy a desired current value. The transistor Tr112 in the current source 11 is connected in cascode to the transistor Tr111 to increase the output resistance of the current source 11 and maintain the current at a constant level with respect to the variation in the voltage of node N1. The differential switch 12 switches the direction of constant current Iout, outputted from the current source 11, according to the complementary digital signals outputted from the driving unit 2 to conduct output current Iout to the non-inverting output terminal DAOUT1 or the inverting output terminal NDAOUT1.

The driving unit 2 generates the complementary digital signals to be outputted to the differential switch 12 according to inputted digital signal Din.

The output load resistors R1 and R2 generates, as output current Iout comes in, a positive phase output voltage to the non-inverting output terminal DAOUT1 and a negative phase output voltage to the inverting output terminal NDAOUT1 respectively, wherein the positive phase and negative phase output voltages are obtained from the current value of output current Iout and the resistance values of the resistors R1 and R2.

Since threshold voltage Vth is obtained from Formula (6) above as described above, it is found that the threshold voltage is proportional to the voltage to be applied to the substrate terminal. Taking advantage of the effect, by applying the third power voltage VDD1 which is higher than the first power voltage VDD to the substrate terminals of the transistors Tr121 and Tr122 included in the differential switch 12, the threshold voltage becomes higher by Vc (V) as shown in Formula (6).

Although this embodiment uses a low voltage withstanding transistors as the transistors Tr121 and Tr122 included in the differential switch 12, it should be naturally understood that transistors, such as a high voltage withstanding transistor having a thick gate insulating film or a transistor having a thin gate insulating film and a high threshold voltage with a different implantation concentration of impurities, may be used.

Since the current switch basic circuit 1 in the current switch circuit A of the second embodiment enables to vary the threshold voltage of the transistors Tr121 and Tr122 included in the differential switch 12 as described above without using an additional circuit such as the offset circuit 301 for a conventional driving unit, it has an advantage of increasing the output voltage range (the range for operation of the P channel type MOS transistors Tr121 and Tr122 included in the differential switch 12 in the saturation region) up to from 0 to 0.3+Vc (V), whereas conventionally limited to the range approximately within from 0 to 0.3 V, without increasing the number of the circuit elements.

Third Embodiment

Figure 4:
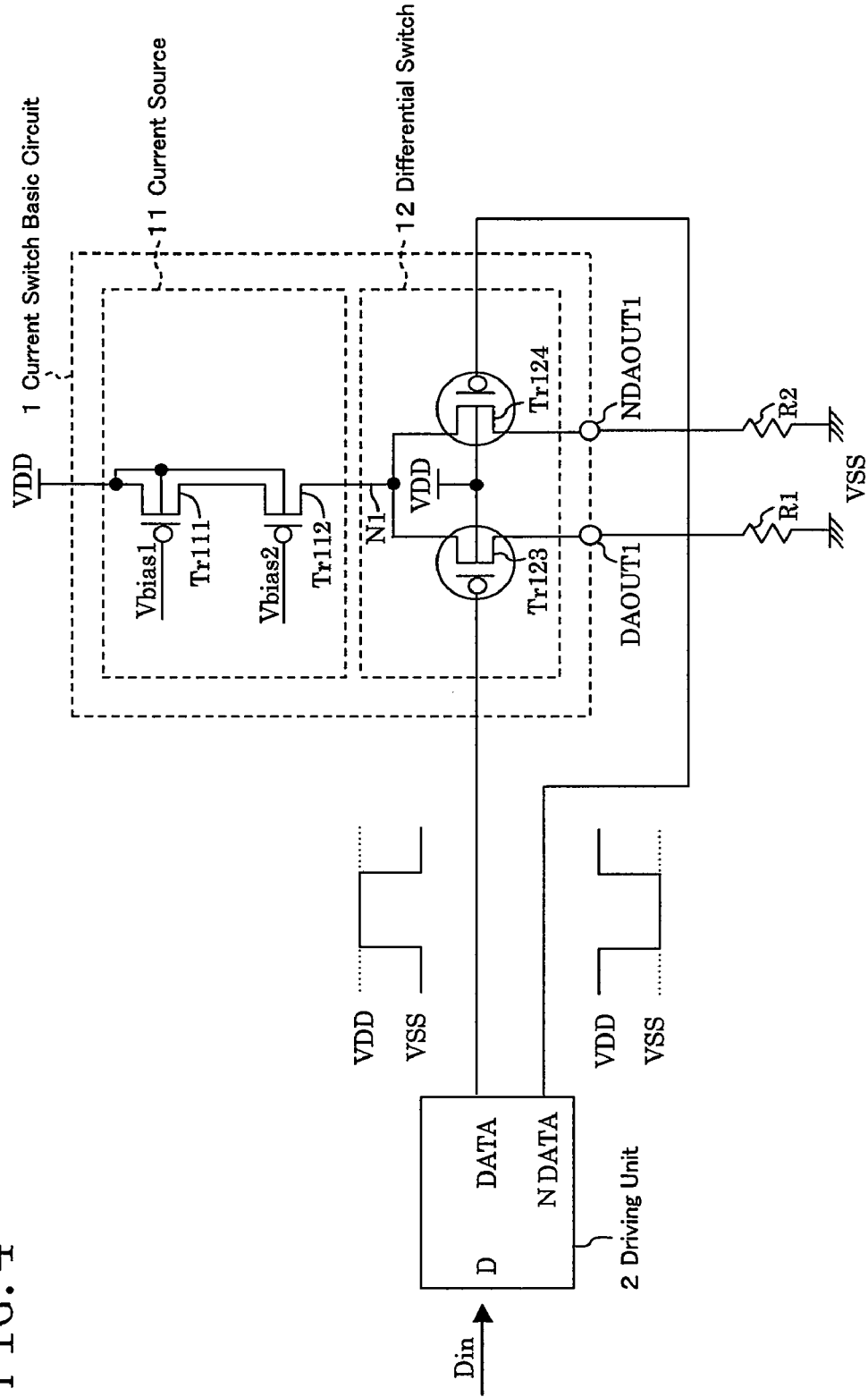
FIG. 4 is a circuit diagram showing a main structure inside of a current switch circuit according to the third embodiment of the present invention.
Figure 5:
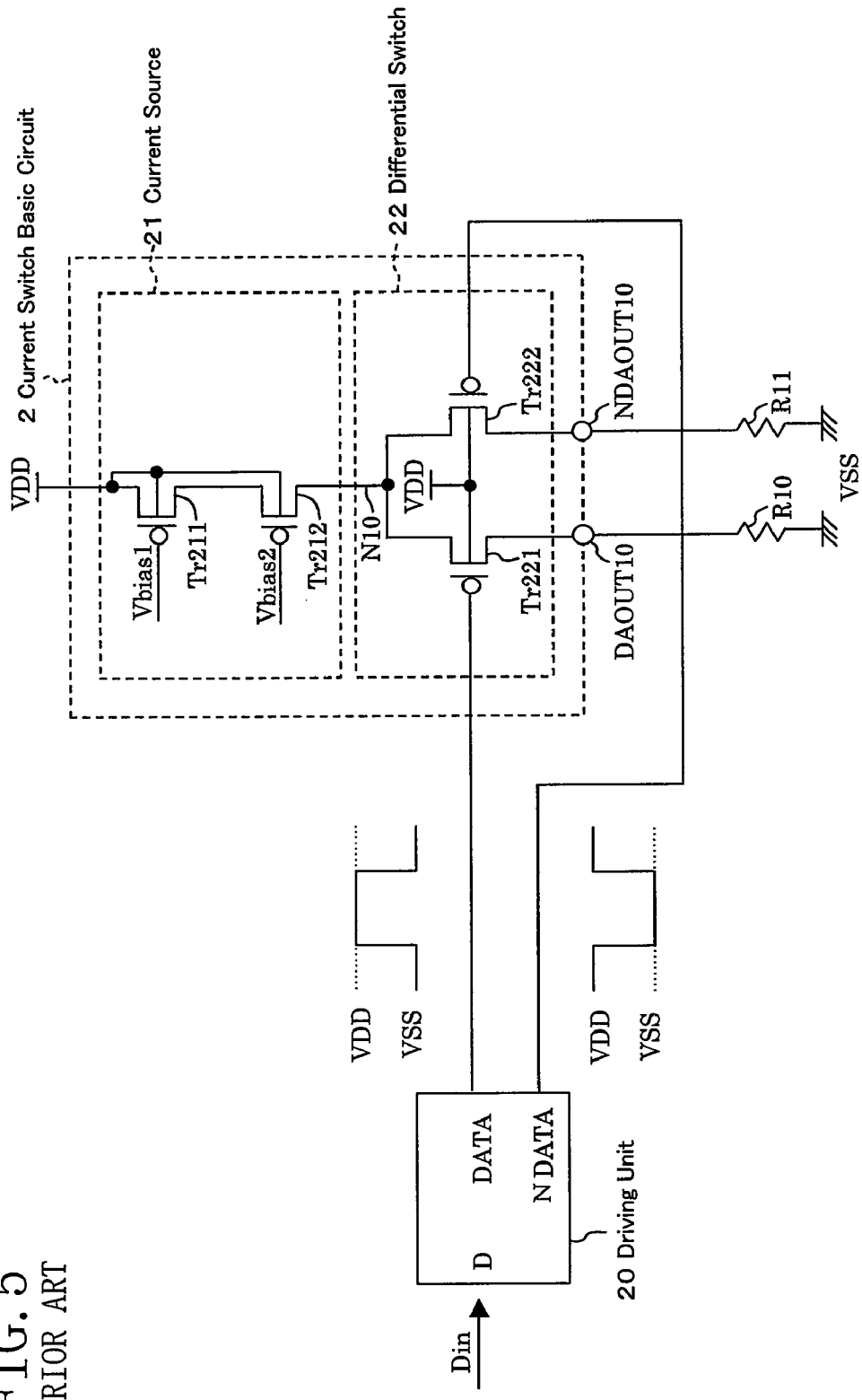
FIG. 5 is a circuit diagram showing a conventional current switch circuit and a driving unit and an output load resistor, both of the circuit.
Figure 6:
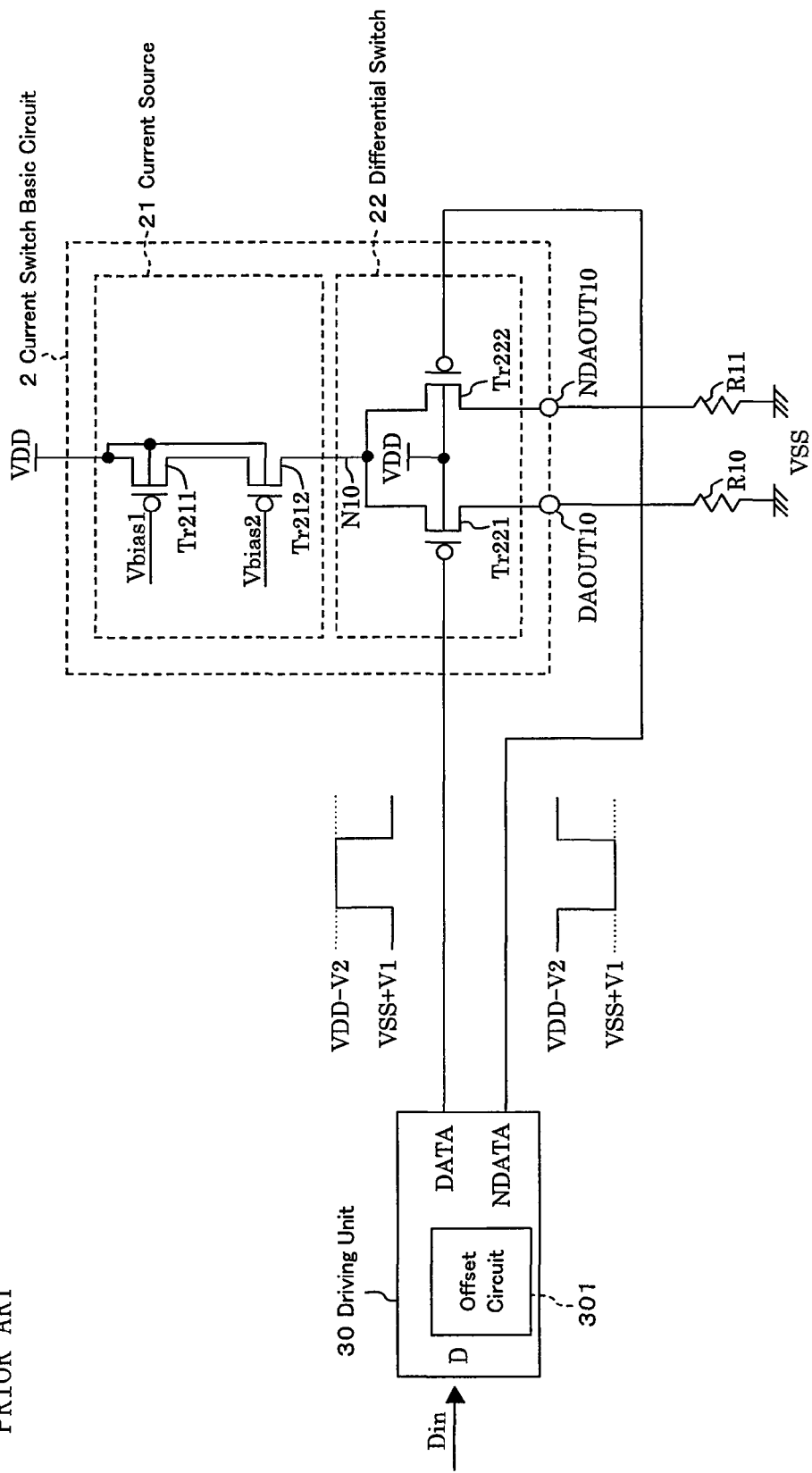
FIG. 6 is a circuit diagram showing a conventional current switch circuit and a driving unit and an output load resistor, both of the circuit.

FIG. 4 shows the structure of the current switch basic circuit 1, the driving unit 2, and the output load resistors R1 and R2 in the current switch circuit A showing the third embodiment of the present invention. Different from the first embodiment, the current switch circuit A does not include a threshold voltage control circuit inside.

In FIG. 4, the current switch basic circuit 1 includes the current source 11 and the differential switch 12. The current source 11 for an operation at a low power voltage includes the low voltage withstanding P channel type MOS transistors Tr111 and Tr112 each having a thin gate insulating film. The transistor Tr111 has the source terminal connected to the first power potential VDD, the drain terminal connected to the source terminal of the transistor Tr112, and the gate terminal to which stabilized voltage Vbias1 is applied. The other transistor Tr112 has the drain terminal connected to the node N1 and the gate terminal to which stabilized voltage Vbias2 is applied. Each of these two transistors Tr111 and Tr112 has the substrate terminal connected to the first power potential VDD.

The differential switch 12 includes the high voltage withstanding P channel type MOS transistors Tr123 and Tr124 each having a thick gate insulating film. The transistor Tr123 has a source terminal connected to the node N1, a drain terminal connected to the non-inverting output terminal DAOUT1, and a gate terminal to which a positive phase digital signal outputted from the driving unit 2 is applied. The other transistor Tr124 has a source terminal connected to the node N1, a drain terminal connected to the inverting output terminal NDAOUT1, and a gate terminal to which a negative phase digital signal outputted from the driving unit 2 is applied. In this structure, the absolute value of threshold voltage Vth of high voltage withstanding transistors is defined to be higher than the absolute value of the threshold voltage of low voltage withstanding transistors (Vth≈0.3 V), and for example, approximately 0.8 V.

The driving unit 2 includes the input terminal D to input a digital signal and the complementary output terminals DATA and NDATA. The output terminal DATA is connected to the gate terminal of the transistor Tr123 included in the differential switch 12, and the output terminal NDATA is connected to the gate terminal of the transistor Tr124.

The output load resistor R1 is connected between the non-inverting output terminal DAOUT1 and the second power potential VSS, and the output load resistor R2 is connected between the inverting output terminal NDAOUT1 and the second power potential VSS.

The description below describes operations of the current switch basic circuit 1, the driving unit 2 and the output load resistors R1 and R2 thus structured.

The transistor Tr111 in the current source 11 operates as a constant current source, and bias voltage Vbias1 is defined to satisfy a desired current value. The transistor Tr112 in the current source 11 is connected in cascode to the transistor Tr111 to increase the output resistance of the current source 11 and maintain the current at a constant level with respect to the variation in the voltage of node N1. The differential switch 12 switches the direction of constant current Iout, outputted from the current source 11, according to the complementary digital signals outputted from the driving unit 2 to conduct output current Iout to the non-inverting output terminal DAOUT1 or the inverting output terminal NDAOUT1.

The driving unit 2 generates the complementary digital signals to be outputted to the differential switch 12 according to inputted digital signal Din.

The output load resistors R1 and R2 generate, as output current Iout comes in, a positive phase output voltage to the non-inverting output terminal DAOUT1 and a negative phase output voltage to the inverting output terminal NDAOUT1 respectively, wherein the positive phase and negative phase output voltages are obtained from the current value of output current Iout and the resistance values of the resistors R1 and R2.

Since, as described, the maximum output voltage is equal to a threshold voltage of the transistors Tr123 and Tr124 included in the differential switch 12 and the transistors Tr123 and Tr124 included in the differential switch 12 employ high voltage withstanding transistors, each of the transistors has the threshold voltage of approximately 0.8 V. The output voltage range is thus determined higher by 0.5 V compared to a case of low voltage withstanding transistors (Vth 0.3 V) as the transistors Tr123 and Tr124 included in the differential switch 12.

Although this embodiment uses a high voltage withstanding transistors, each having a thick gate insulating film, as the transistors Tr123 and Tr124 included in the differential switch 12, it should be naturally understood that transistors, such as a transistor having a high threshold voltage and having the gate insulating film of the film thickness same as that of a low voltage withstanding transistor with a different implantation concentration of impurities, may be used.

Since the current switch basic circuit 1 in the current switch circuit A of the third embodiment enables to increase the absolute value of the threshold voltage of the transistors Tr123 and Tr124 included in the differential switch 12 as described above without using an additional circuit such as the offset circuit 301 for a conventional driving unit, it has an advantage of increasing the output voltage range (the range for operation of the P channel type MOS transistors Tr123 and Tr124 included in the differential switch 12 in the saturation region) up to from 0 to 0.8 V, whereas conventional technique was limited to the range approximately within from 0 to 0.3 V, without increasing the number of the circuit elements.

Although the two transistors Tr121 and Tr122 included in the differential switch 12 are formed of P channel type field effect transistors in the description above, it should be naturally understood that they also may be formed of N channel type field effect transistors (a differential switch for a current source of N channel type field effect transistors is generally an N channel type, too). Although such current switch basic circuit 1 is favorably integrated with the current steering D/A converter 10, it also may be used for other circuits.

The current steering D/A converter 10 described above is use for transmission unit (a semiconductor integrated circuit) for transmitting an analog signal of, for example, an LSI for a wireless LAN, a mobile phone, a cable modem, or an ADSL modem and a communication device such as a wireless LAN device having such a transmission unit.

Although the description used the current switch circuit A as an example, the threshold voltage control circuit 5 also may be applied to other circuits (for example, a source follower circuit, an operational amplifier circuit, and the like) that have the properties changed in accordance with a change in the threshold of the transistor.

Industrial Applicability

As described above, the present invention controls, for example, the threshold voltage of transistors included in a differential switch in a current switch circuit at a high level to improve the problem of decrease in the dynamic range under low power voltage, realize a wider output voltage range, and reduce the increase in the area and power consumption. The invention also maintains the output voltage range at a constant level regardless of production process variations, particularly threshold voltage variations, to remain stable against production variations, and is thus useful as, for example, a D/A converter, a semiconductor integrated circuit including the same, and a communication device including the semiconductor integrated circuit.

The invention claimed is:

1. A current switch circuit comprising a current source and a differential switch connected to an output terminal of the current source, wherein
the current source includes at least one transistor having a gate terminal to which a bias voltage is applied that determines a value of a current to conduct,
the differential switch includes first and second transistors, the transistors having source terminals connected to an output terminal of the current source in parallel, drain terminals as first and second output terminals respectively, and gate terminals to which complementary signals are inputted,
the first and second transistors of the differential switch has the threshold voltage determined to have an absolute value greater than an absolute value of a threshold voltage of the transistor included in the current source,
the transistor included in the current source is formed of a low voltage withstanding transistor having a gate insulating film with a predetermined thickness,
each of the first and second transistors included in the differential switch is formed of a high voltage withstanding transistors having a gate insulating film with a thickness thicker than the predetermined thickness of the gate insulating film of the low voltage withstanding transistor, and
the threshold voltage of the first and second transistors included in the differential switch is determined higher than a threshold voltage of the transistor included in the current source.

2. A current switch circuit comprising a current source and a differential switch connected to an output terminal of the current source, wherein
the current source includes at least one transistor having a gate terminal to which a bias voltage is applied that determines a value of a current to conduct,
the differential switch includes first and second transistors, the transistors having source terminals connected to an output terminal of the current source in parallel, drain terminals as first and second output terminals respectively, and gate terminals to which complementary signals are inputted,
the first and second transistors of the differential switch has the threshold voltage determined to have an absolute value greater than an absolute value of a threshold voltage of the transistor included in the current source,
each of the first and second transistors included in the differential switch has an implantation concentration of impurities which is determined to be different from an implantation concentration of impurities to the transistor included in the current source, and
the threshold voltage of the first and second transistors included in the differential switch is determined higher than a threshold voltage of the transistor included in the current source.

3. The current switch circuit according to claim 1, wherein the transistor included in the current source has a substrate terminal to which a predetermined voltage is applied,
a voltage higher than the predetermined voltage is applied to the substrate terminal of each of the first and second transistors included in the differential switch, and
the threshold voltage of the first and second transistors included in the differential switch is determined to be higher than a threshold voltage of the transistor included in the current source.

4. A D/A converter comprising the current switch circuit according to claim 1.

5. A semiconductor integrated circuit comprising the D/A converter according to claim 4.

6. A communication device comprising the semiconductor integrated circuit according to claim 5.

7. The current switch circuit according to claim 2, wherein the transistor included in the current source has a substrate terminal to which a predetermined voltage is applied,
a voltage higher than the predetermined voltage is applied to the substrate terminal of each of the first and second transistors included in the differential switch, and
the threshold voltage of the first and second transistors included in the differential switch is determined to be higher than a threshold voltage of the transistor included in the current source.

8. A D/A converter comprising the current switch circuit according to claim 2.

9. A semiconductor integrated circuit comprising the D/A converter according to claim 8.

10. A communication device comprising the semiconductor integrated circuit according to claim 9.

11. A current switch circuit comprising a current source and a differential switch connected to an output terminal of the current source, wherein
the current source includes a transistor formed of a low voltage withstanding transistor having a gate insulating film with a predetermined thickness,
the differential switch includes first and second transistors formed of a high voltage withstanding transistors having a gate insulating film with a thickness thicker than the predetermined thickness of the gate insulating film of the low voltage withstanding transistor, and
the threshold voltage of the first and second transistors included in the differential switch is higher than a threshold voltage of the transistor included in the current source.

12. A current switch circuit comprising a current source and a differential switch connected to an output terminal of the current source, wherein
the current source includes a transistor,
the differential switch includes first and second transistors having an implantation concentration of impurities which is determined to be different from an implantation concentration of impurities to a transistor included in the current source, and
the threshold voltage of the first and second transistors included in the differential switch is higher than a threshold voltage of the transistor included in the current source.

* * * * *